United States Patent [19]
Yoshida et al.

[11] Patent Number: 4,997,747
[45] Date of Patent: * Mar. 5, 1991

[54] METHOD FOR THE FORMATION OF A DIFFRACTION GRATING

[75] Inventors: Toshihiko Yoshida, Tenri; Haruhisa Takiguchi; Shinji Kaneiwa, both of Nara; Sadayoshi Matsui, Tenri, all of Japan

[73] Assignee: Sharp Kabushiki Kaisha, Osaka, Japan

[*] Notice: The portion of the term of this patent subsequent to Feb. 21, 2006 has been disclaimed.

[21] Appl. No.: 253,811

[22] Filed: Oct. 5, 1988

Related U.S. Application Data

[63] Continuation-in-part of Ser. No. 65,145, Jun. 24, 1987, Pat. No. 4,806,454, which is a continuation of Ser. No. 812,784, Dec. 23, 1985, abandoned.

[30] Foreign Application Priority Data

Dec. 27, 1984 [JP] Japan ............................... 59-278999
Dec. 23, 1985 [EP] European Pat. Off. ......... 85309444.9

[51] Int. Cl.$^5$ .............................................. G03F 7/20
[52] U.S. Cl. ......................................... 430/321; 430/1; 430/323; 430/329; 350/3.6; 350/162.11
[58] Field of Search .................. 430/1, 321, 323, 329; 350/3.6, 162.11; 372/96, 102

[56] References Cited

U.S. PATENT DOCUMENTS

| | | | |
|---|---|---|---|
| 3,916,182 | 10/1975 | Dabby et al. | 350/96.13 |
| 4,120,559 | 10/1978 | Abramson et al. | 350/3.6 |
| 4,402,571 | 9/1983 | Cowan | 350/162.17 |
| 4,806,442 | 2/1989 | Shirasaki et al. | 430/4 |
| 4,806,454 | 2/1989 | Yoshida et al. | 430/321 |

FOREIGN PATENT DOCUMENTS

11094484 12/1960 Fed. Rep. of Germany .

OTHER PUBLICATIONS

Mashev et al., (1981) Appl. Phys., A26, No. 3, pp. 143-149.
Koentjoro et al., *Japanese J. Appl. Phys.* 23(10): L791-L794 (1984).
Utaka et al., *Electronics Letters* 20(24): 1008-1010 (1984).
Suzuki et al., *Proc. Soc. Photo-Optical Instrumentation Engineers* 239: 10-18 (1980).
*Optical Integrated Circuits* (1985) pp. 161 and 168-169.

Primary Examiner—Jose G. Dees
Attorney, Agent, or Firm—Irell & Manella

[57] ABSTRACT

A method for the formation of a diffraction grating on a substrate using a holographic technique and an etching technique, wherein the periodicity of the pattern of the diffraction grating can be changed at will by a change of the light-path length of one of the two light fluxes from a holographic exposing system.

2 Claims, 3 Drawing Sheets

FIG.1(I)
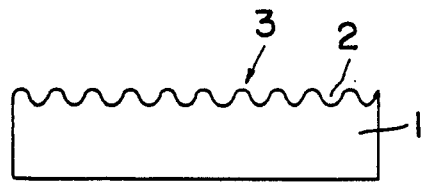
FIG.1(II)
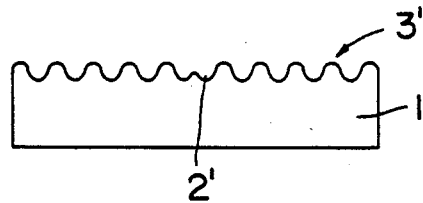
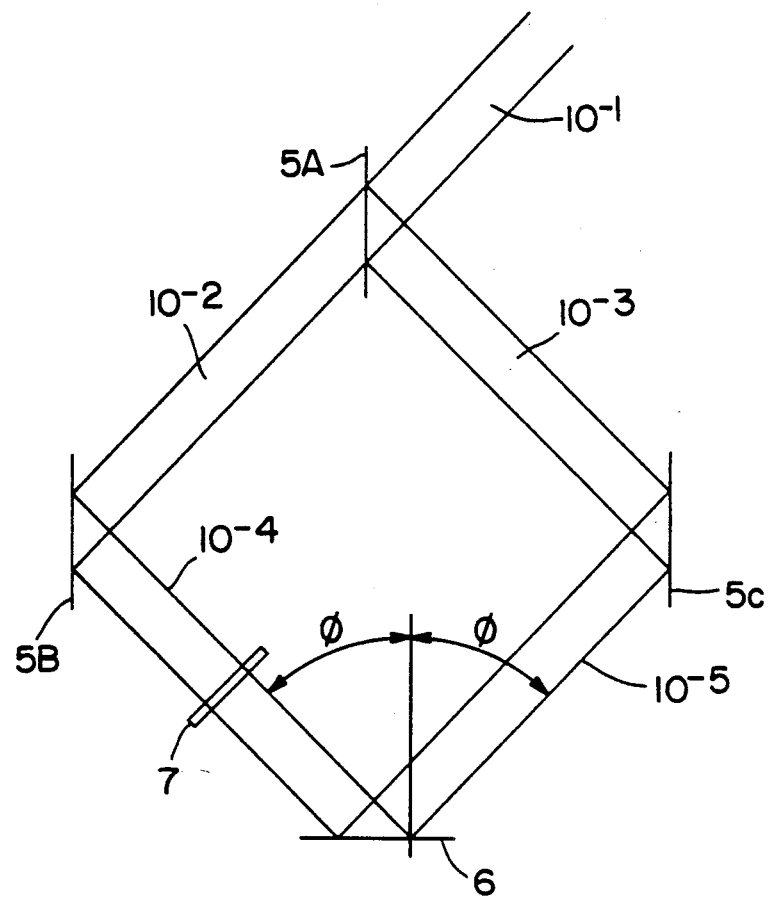
FIG. 2

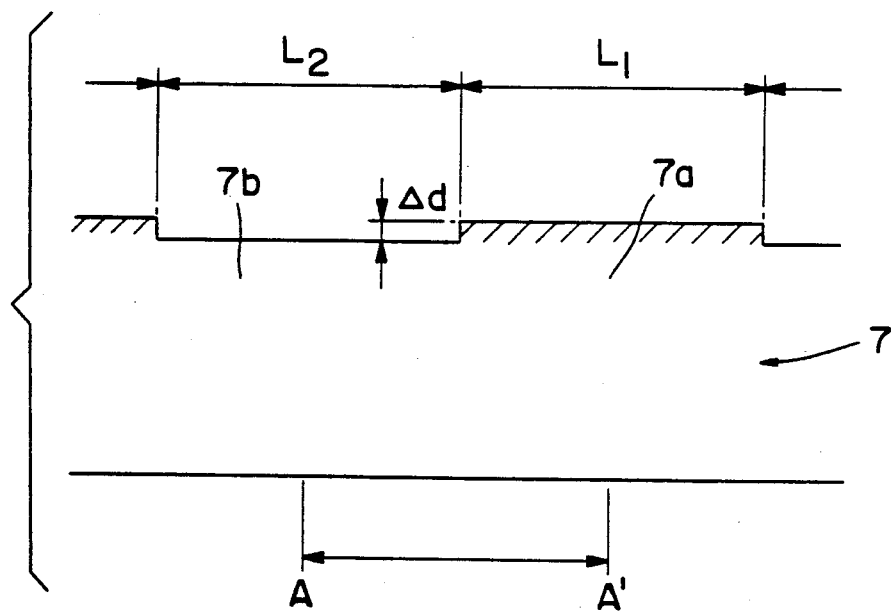
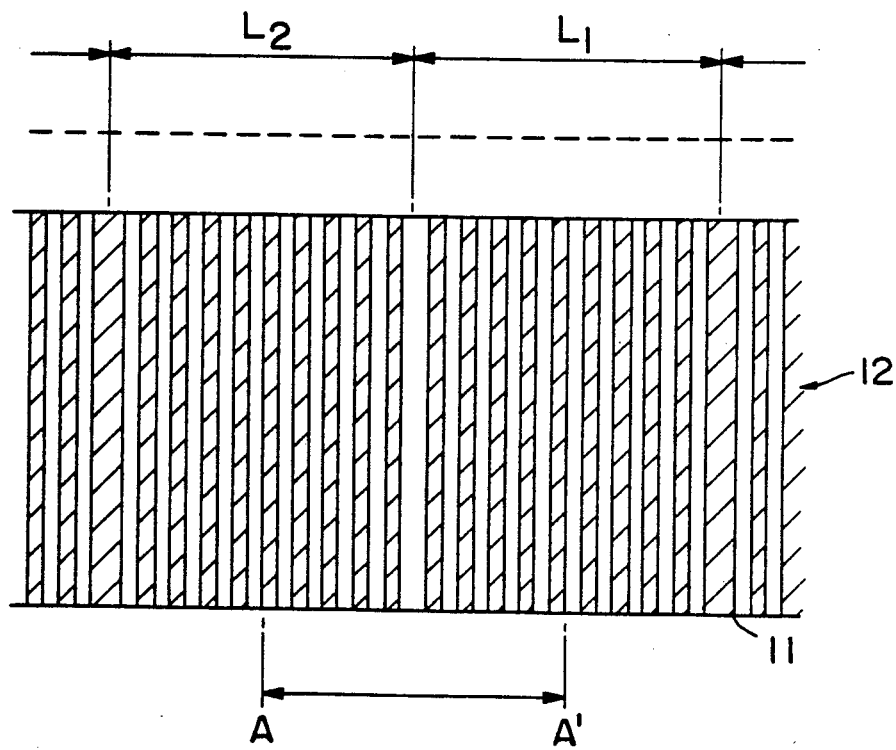

FIG. 5(III)
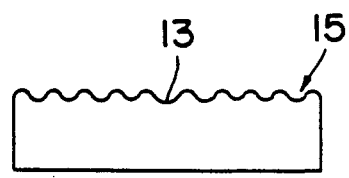

METHOD FOR THE FORMATION OF A DIFFRACTION GRATING

BACKGROUND OF THE INVENTION

1. Cross-Reference to Related Applications

This application is a continuation-in-part of U.S. Pat. Application Ser. No. 07/065,145, filed Jun. 24, 1987, U.S. Pat. No. 4,806,454 which is a continuation of Ser. No. 812,784 filed Dec. 23, 1985, abandoned.

2. Field of the Invention

This invention relates to a method for the formation of diffraction gratings. More particularly, it relates to a method for the formation of diffraction gratings with a periodicity of approximately 2000 Å on the surface of a semiconductor substrate, in which the phase of the diffraction gratings can be changed at will.

3. Description of the Prior Art

A diffraction grating with a periodicity is formed on the surface of a semiconductor crystal, resulting in the reflecting surface of a distributed-feedback (DFB) laser. This distributed-feedback laser is advantageous over other lasers in that cleavage of the crystal is not required for the formation of the resonator, integration can be readily attained, and stabilized single-mode operation can be readily provided. However, as shown in FIG. 1(I), with a distributed-feedback laser in which the diffraction grating 3 composed of grooves 2 with a periodicity on the upper surface of substrate 1, stabilized oscillation in a single mode cannot be achieved. In particular, it is not possible to obtain single-mode operation when high-speed modulation is involved, as when the laser is being used as a light source for optical communication apparatus. In order to solve this problem, a distributed-feedback semiconductor laser such as that shown in FIG. 1(II) has been proposed in recent years in which the grooves 2' of the diffraction grating 3' in the region of the center of the resonator is shifted by half a cycle (namely, the phase of the pattern of the diffraction grating is shifted by $\pi$).

The phase shift of the diffraction grating in the middle of the laser resonator is achieved as follows: A photoresist is coated on a semiconductor substrate and exposed by an electronic beam-exposing system and then developed to form the portions corresponding to the grooves of the diffraction grating. The substrate is then etched with an etchant. The remaining photoresist on the substrate functions as an etching mask. However, while the phase of the diffraction grating can be changed at will, to construct even one semiconductor laser is extremely time-consuming; productivity is low, costs are high, and thus the method is not practical. Alternatively, a positive photoresist, in which areas which have been exposed to light are removed by a development process, is coated on the right half of the laser resonator, and a negative photoresist, in which areas which have not been exposed to light are removed by a development process, is coated on the left half of the resonator. Then, both the photoresists are exposed by a holographic exposing system and developed, and the remaining photoresist is used as a mask in the succeeding etching process However, the efficiency of the negative resist is poor, and the application of the resist is difficult. Moreover, the phase shift is limited to only $\pi$.

SUMMARY OF THE INVENTION

The method of this invention which overcomes the above-discussed and numerous other disadvantages and deficiencies of the prior art, is a method for the formation of a diffraction grating on a substrate using a holographic technique and an etching technique, wherein the periodicity of the pattern of the diffraction grating can be changed at will by a change of the light-path length of one of the two light fluxes from a holographic exposing system.

The change of the light-path length of one of the two light fluxes from the holographic exposing system is, in a preferred embodiment, achieved by passing said light flux through a transparent board of uneven thickness.

The difference $\Delta d$ in thickness between the thicker portion and the thinner portion of said transparent board has, in a preferred embodiment, the following relationship to the wavelength of the light passing through said transparent board:

$$n \cdot \Delta d = \lambda/4$$

The width of the thicker portion of said transparent board is, in a preferred embodiment, equal to that of the thinner portion of said transparent board.

The width of both the thicker portion and the thinner portion of said transparent board is, in a preferred embodiment, equal to the length of a semiconductor laser resonator which is obtained using the substrate having said diffraction grating thereon.

Thus, the invention described herein makes possible the objects of (1) providing a simple method for the formation of a diffraction grating, the phase of which is changed by $\pi$ in the middle of a semiconductor laser resonator; (2) providing a method for the formation of a diffraction grating which is applied to produce a distributed-feedback semiconductor laser device having a diffraction grating the phase of which is changed by $\pi$ in the middle of the semiconductor laser resonator, said laser device oscillating in a stabilized single mode even when high-speed modulation is involved as when the laser device is used as a light source for optical communication; and (3) providing a method for the formation of a diffraction grating which is also applied to produce a distributed Bragg reflection semiconductor laser device.

BRIEF DESCRIPTION OF THE DRAWINGS

This invention may be better understood and its numerous objects and advantages will become apparent to those skilled in the art by reference to the accompanying drawings as follows:

FIG. 1(I) is a front view of the substrate having the diffraction grating thereon with a uniform phase.

FIG. 1(II) is a front view of the substrate having the diffraction grating thereon, exhibiting an altered phase pattern in the center portion of the substrate.

FIG. 2 is a diagram showing a holographic exposing system used in this invention.

FIG. 3 is a sectional front view showing the transparent board shown in FIG. 2.

FIG. 4 is a plane view showing interference fringes formed on a photoresist which is coated on the substrate.

DESCRIPTION OF THE PREFERRED EMBODIMENTS

Figure 5I:
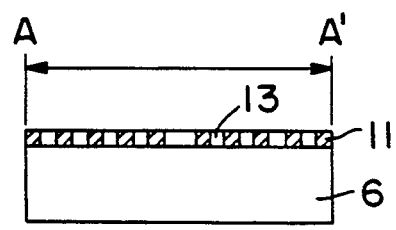
FIGS. 5(I), (II) and (III), respectively, are diagrams showing the production processes of a diffraction grating, exhibiting an altered phase pattern in the center portion of the substrate, according to this invention.

This invention provides a method for the formation of a diffraction grating in which by passing one of the two light fluxes from a holographic exposing system through a transparent board of uneven thickness, a change of the light-path length is achieved at will, thereby attaining a change of the periodicity of the pattern of the diffraction grating.

FIG. 2 shows a holographic exposing system used in this invention, which comprises a beam splitter 5A and a pair of plane mirrors 5B and 5C. On the light path from the plane mirror 5B to a substrate 6 on which the diffraction grating is formed, a transparent board 7 is disposed.

A light flux 10-1 which is interferential and in parallel, e.g., He-Cd laser light with a wavelength of 4416 Å, is incident upon the beam splitter 5A of the above-mentioned holographic exposing system to be split into two light fluxes 10-2 and 10-3 having the same optical intensity, which are then incident upon the plane mirrors 5B and 5C, respectively. The reflected light fluxes 10-4 and 10-5 from the mirrors 5B and 5C, respectively, are superposed on a photoresist coated on the substrate 6 resulting in interference fringes. Since the reflected light flux 10-4 from the mirror 5B reaches the photoresist on the substrate 6 through the transparent board 7, the light-path length of the light flux 10-4 is different when compared with the other reflected light flux 10-5 from the mirror 5C, resulting in interference fringes on the photoresist of the substrate 6.

FIG. 3 shows the transparent board 7 of uneven thickness, in which the width $L_1$ of the thicker portion 7a is equal to the width $L_2$ of the thinner portion 7b, and the widths $L_1$ and $L_2$ are equal to the length L of the finally obtainable semiconductor laser resonator. Moreover, the difference $\Delta d$ in thickness between the thicker portion 7a and the thinner portion 7b of the board 7 (i.e., the difference $\Delta S$ between the light-path length of the light passing through the thicker portion 7a and that of the light passing through the thinner portion 7b) is one-fourth times the wavelength $\lambda$ of the laser light as represented by the equation:

$$n \cdot \Delta d = \lambda/4$$

(n is a refractive index of the board.)

The transparent board (or a phase board) 7 can be produced by subjecting silicon oxide film vaporized on a parallel board made of the fusion of quartz to a photolithographic treatment.

Figure 5:
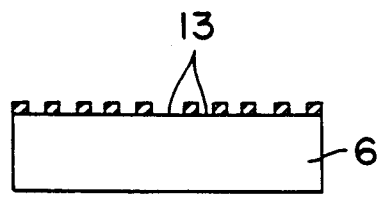

By the use of the transparent board 7 having the above-mentioned structure, as shown in FIGS. 4 and 5(I), the interference fringes 12 which are composed of the light and dark areas with an inversion in the center of the middle region A—A′ of the substrate 6 are formed on the photoresist 11 coated on the substrate 6 (the non-slash areas in FIG. 4 indicate the photosensitive areas). The photoresist 11 is then developed, and as shown in FIG. 5(II), the photosensitive areas are eliminated, resulting in grooves 13 parallel to each other.

The substrate 6 is then etched with an etchant ($HBr:HNO_3:CH_3OH = 1:1:5$). The remaining photoresist serves as an etching mask. The mask is then removed, resulting in a diffraction grating 15 on the substrate 6, in which the phase of the groove 13 is shifted by $\pi$ in the center of the obtained semiconductor laser resonator.

Although the above-mentioned example describes only the method for the formation of a diffraction grating the phase of which is changed by $\pi$ in the center of a semiconductor laser resonator, it is not limited thereto. By the modification of the difference $\Delta d$ in thickness of the transparent board between the thicker portion and the thinner portion and/or the widths $L_1$ and $L_2$ of the thicker portion and the thinner portion of the transparent board, diffraction gratings having a variety of phases can be produced. A transparent board with an uneven refractive index—i.e., a board having two or more segments of differing refractive indices—can also be used to change the path length of one portion of one of two light fluxes.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A method for the formation of a diffraction grating on a substrate using a holographic technique and an etching technique, the method comprising the steps of:
    coating a photoresist on said substrate;
    forming interference fringes on said photoresist by superposing two light fluxes from a holographic exposing system on said photoresist, wherein a transparent board is placed in the path of one but not both of said two light fluxes so that a difference in light path length is created between a portion of said one light flux and the remaining portion;
    developing said photoresist to eliminate photosensitive areas thereon;
    etching said substrate using remaining photoresist as an etching mask; and
    removing said etching mask from said substrate, thus providing a diffraction grating on said substrate, whereby
    a phase shift is introduced at a discrete point within the diffraction grating as a result of said difference in light path length.

2. A method for the formation of a diffraction grating according to claim 1, wherein said transparent board has an uneven refractive index, and the difference in light path length of one of the two light fluxes from the holographic exposing system is achieved by passing said one light flux through said transparent board of uneven refractive index.

* * * * *